(12) United States Patent
Hess et al.

(10) Patent No.: US 7,550,318 B2
(45) Date of Patent: Jun. 23, 2009

(54) INTERCONNECT FOR IMPROVED DIE TO SUBSTRATE ELECTRICAL COUPLING

(75) Inventors: Kevin J. Hess, St. Ismier (FR); Chu-Chung Lee, Round Rock, TX (US); James W. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 515 days.

(21) Appl. No.: 11/502,679

(22) Filed: Aug. 11, 2006

(65) Prior Publication Data

US 2008/0038912 A1    Feb. 14, 2008

(51) Int. Cl.
*H01L 21/00* (2006.01)
*H01L 23/48* (2006.01)
*H01L 23/52* (2006.01)
*H01L 29/40* (2006.01)

(52) U.S. Cl. ............... 438/119; 257/783; 257/E21.514; 257/E23.018

(58) Field of Classification Search ............... 438/119; 257/783
See application file for complete search history.

(56) References Cited

U.S. PATENT DOCUMENTS

| | | | | |
|---|---|---|---|---|
| 5,600,183 | A * | 2/1997 | Gates, Jr. | 257/783 |
| 5,891,761 | A * | 4/1999 | Vindasius et al. | 438/109 |
| 6,420,208 | B1 | 7/2002 | Pozder et al. | |
| 6,509,207 | B1 * | 1/2003 | Liu | 438/108 |
| 6,875,367 | B2 * | 4/2005 | Hsieh et al. | 252/62.51 R |
| 6,878,305 | B2 * | 4/2005 | Hsieh et al. | 252/62.51 R |
| 6,897,553 | B2 * | 5/2005 | King et al. | 257/686 |

* cited by examiner

*Primary Examiner*—David A Zarneke
(74) *Attorney, Agent, or Firm*—John A. Fortkort; Fortkort & Houston P.C.

(57) ABSTRACT

A method is provided for forming peripheral contacts between a die and a substrate. In accordance with the method, a die (305) is provided which has first and second opposing major surfaces, wherein the first major surface is attached to a substrate (303) having a first group (323) of contact pads disposed thereon, and wherein the second major surface has a second group (311) of contact pads disposed thereon. An electrically conductive pathway (326) is formed between the first and second groups of contacts with an electrically conductive polymeric composition.

20 Claims, 5 Drawing Sheets

INTERCONNECT FOR IMPROVED DIE TO SUBSTRATE ELECTRICAL COUPLING

FIELD OF THE DISCLOSURE

The present disclosure relates generally to semiconductor devices, and more particularly to methods for forming electrically conductive pathways between the contacts of a die and those of a substrate.

BACKGROUND OF THE DISCLOSURE

In a typical semiconductor fabrication process, integrated circuits are formed on semiconductor substrates using a number of different processing techniques to create the transistors, resistors, capacitors, interconnects, and the various other circuit elements of a semiconductor device. In some processes, portions of the circuit which are designed for a specific functionality are formed separately on a die, and the die is then mounted on a packaging substrate and used to impart that functionality to a host device. The die circuitry is typically accessed from bond pads formed on the final metal layer of the die. Hence, the bond pads provide a means for the transfer of electrical signals and power from and to the die via bonding wires, conductive bumps, and other elements of the conductive pathway formed between the die and the packaging substrate. The packaging substrate, in turn, provides electrical connections between the die and other circuit elements.

In the case of flip chip packaging, the die is equipped with solder balls formed on the bond pads, and is flipped onto the complementing bond pads of the packaging substrate. Thermal processing of the die/package sandwich completes the electrical connection through the formation of solder joints. An under-fill adhesive is typically applied between the die and packaging substrate which, in conjunction with the solder joints, physically bonds the die to the packaging substrate. Frequently, an adhesive fillet is also applied to the sides of the die as an additional bond between the die and the packaging substrate.

FIG. 1 depicts one example of a flip-chip packaged semiconductor device 100 known to the art which illustrates some of the principles described above. The semiconductor device 100 depicted therein comprises a bulk silicon substrate 102 and a buried oxide layer 104 which separates the bulk silicon substrate 102 from the functional device area 106, the later of which may include various functional circuit elements as are known to the art. The functional area of the semiconductor device 100 also includes an edge seal 126 near the edge 124 of the die. This edge seal 126 may be continuous and typically surrounds the entire die or functional device area 106. The edge seal 126 is made of stacked continuous bands or rings of metal that are formed on every metal and via layer of the functional device area.

The continuous bands or rings of edge seal metal are exposed during wafer dicing. This process may result in unintentional damage to the metal structure or dielectric material of the ring, thereby compromising the ability of the ring to seal out moisture and ionic contaminants. This may be especially true when the dielectric material is a low-k dielectric, since these materials are often mechanically weak and permeable to moisture.

A conductive fillet 118, which may comprise a metal epoxy, contacts the edge 124 of the die and is utilized to provide an electrical ground contact between the bulk silicon 102, the functional device area 106 (by way of the exposed edge seal metal), and the substrate 114 by way of a substrate contact pad 116. The device of FIG. 1 is also equipped with a solder bump interconnect 108 that provides electrical contact between the die and the packaging substrate 114 by way of an interconnect bond pad 110 in the die and a packaging bond pad 112 on the packaging substrate 114. The device is further equipped with a polyimide layer 120 and an epoxy underfill 122.

FIG. 2 depicts one example of a conventional wire-bond packaged semiconductor device 201. As seen therein, the device 201 comprises a packaging substrate 203 upon which is mounted a semiconductor die 205. A plurality of solder balls 207 are mounted on one face of the packaging substrate 203 to enable connection thereof to a host device. The die 205 is mounted to the opposing face of the packaging substrate 203 by way of a die attach adhesive 209.

The die 205 is equipped about edge 230 of its upper surface with a row of wire-bond pads 211. The row of wire-bond pads 211 may form a bond pad ring around the perimeter of the upper surface of die 205. The wire-bond pads 211 on the semiconductor die 205 are electrically connected to wire-bond posts 217 on the packaging substrate via bond wires 218. Each individual wire-bond pad 211, and its associated wire-bond post 217 and bond wire 218, may provide either power, ground, or Input/Output (I/O) signal coupling between the die 205 and the packaging substrate 203. An adhesive fillet 226 is provided to further secure the die 205 to the packaging substrate 203. In some cases, the adhesive fillet 226 may be formed of the same material as the die attach adhesive 209. Though not shown, a molding material may be applied to complete the structure.

DETAILED DESCRIPTION

Figure 1:
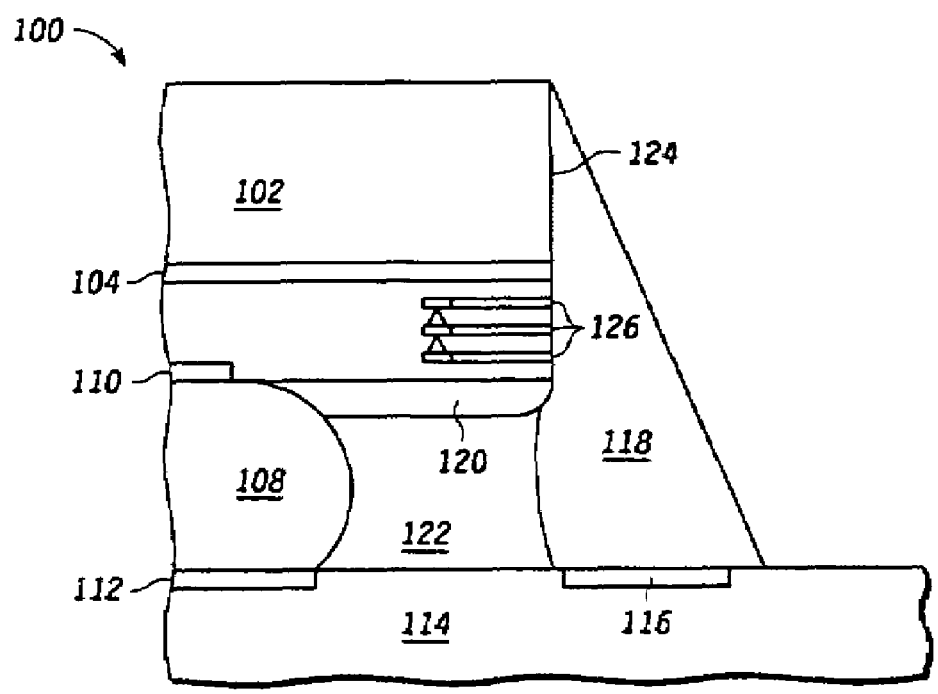
FIG. 1 is an illustration of a prior art semiconductor device.
Figure 2:
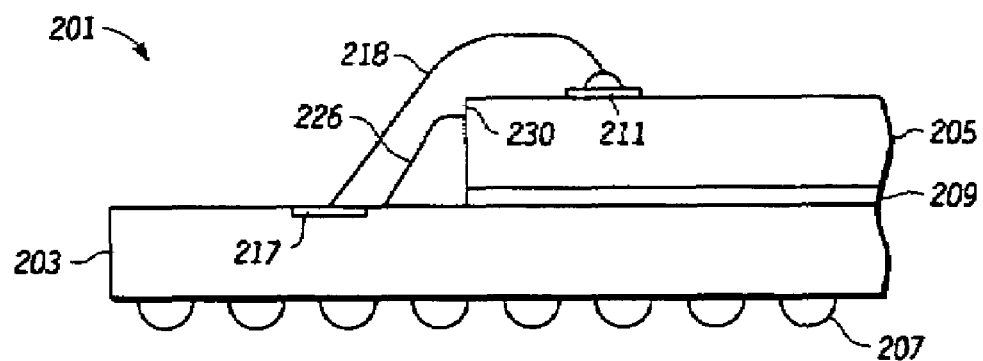
FIG. 2 is an illustration of a prior art semiconductor device.

It has become increasingly challenging to implement wire bond structures of the type depicted in FIG. 2 as the required I/O signal count on the die increases. Due to these rapidly increasing I/O signal counts, the bond pad ring around the periphery of the die in many new generation wire-bond products is growing faster than the corresponding die core circuitry area. This often leads to pad limited designs, in which the die size is fixed by the number of pads in the bond pad ring, and may result in wasted or unused area in the die core circuitry area.

To avoid this problem, designers often reduce (to below optimum design levels) the number of power and ground pads placed in the die bond pad ring, which may result in the die circuitry being power starved. In particular, insufficient numbers of die-to-substrate ground connections on wire bonded packaged parts produce variations in the die ground plane and, therefore, differences in how individual I/O signals "see" the ground. The resulting ground bounce and simultaneous switching noise (SSN) as gangs of input/outputs (IOs) are toggled may seriously interfere with the normal operation of the semiconductor die.

There is thus a need in the art for methods and devices which address the aforementioned infirmities. These and other needs may be met by the devices and methodologies described herein.

In one aspect, a method is provided for forming electrical contacts between a first semiconductor device and a substrate, such as, for example, a die and a packaging substrate, or a first and second die. In accordance with the method, a first semiconductor device is provided which has first and second opposing major surfaces, wherein the first major surface is attached to a substrate having a first group of contact pads disposed thereon, and wherein the second major surface has a second group of contact pads disposed thereon. An electrically conductive pathway is then formed between the first and second groups of contact pads with an electrically conductive polymeric composition.

In another aspect, a device is provided which comprises (a) a substrate having a first group of contact pads disposed thereon; and (b) a first semiconductor device having first and second opposing major surfaces, wherein the first major surface is attached to the substrate, wherein the second major surface has a second group of contact pads disposed thereon, and wherein the first and second group of contacts are in electrical communication with each other by way of an electrically conductive polymeric composition.

These and other aspects of the present disclosure are described in greater detail below.

It has now been found that the aforementioned infirmities in the art may be overcome through the use of an electrically conductive polymeric material, such as a conductive adhesive or ink, to electrically couple contact pads (which may include contact rings) on the top surface of a first semiconductor device (which may be, for example, a die) to contact pads disposed on a second semiconductor device (which may be, for example, a packaging substrate or another die). This approach may be used, for example, to electrically couple a die ground and a substrate ground. More specifically, this approach may be used, for example, to create ground path(s) between peripheral ground points on the top side of a wire bond die and a substrate ground point. The resulting ganged ground path can be used to replace most or all of the conventional individually created wire bond ground jumper wires that are typically used to connect the individual ground wire-bond pads on a die to a package substrate ground ring or ground bond posts. In many applications, this approach can improve electrical coupling between the die and the substrate, thereby reducing ground bounce and simultaneous switching noise.

Moreover, because this approach can provide die and substrate ground connections that are not wire bonded, it reduces or eliminates the need for dedicated ground wire-bond pads in the die pad ring. For die which are bond pad limited, this approach may allow for reduced die size. In many applications, this approach will allow also greater flexibility in the layout of the bond pads overlying the I/O circuitry on the die. In addition, some or all of the ground connection bond posts on the substrate may be eliminated and replaced with a narrow contact pad ring adjacent to the die footprint on the substrate. This, in turn, may provide more space for signal pad routing and stagger, helping to reduce cross-talk in high density wire bond designs. Additional benefits may be found in die or package size reductions with the reduction in the size of the ground connections.

Figure 3:
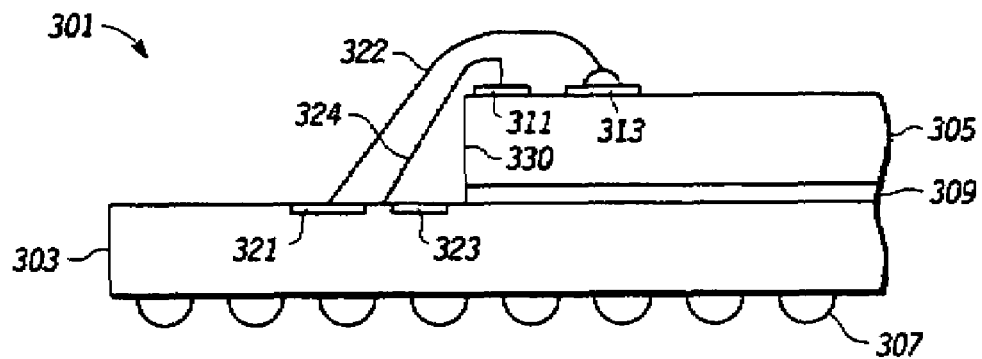
FIG. 3 is an illustration of an embodiment of a semiconductor device made in accordance with the teachings herein.

FIG. 3 illustrates a first particular, non-limiting embodiment of a semiconductor device in accordance with the teachings herein. The device 301 depicted therein comprises a packaging substrate 303 having a semiconductor die 305 disposed on a first major surface thereof. The second opposing major surface of the package substrate 303 in this particular embodiment is equipped with a plurality of solder balls 307 disposed in a ball grid array (BGA) so that the semiconductor device 301 may be mounted on a host device (not shown). The die 305 is attached to the packaging substrate 303 with a layer of adhesive 309, which may be electrically conductive or insulating. In other embodiments, a solder fillet may be used for this purpose.

The die 305 in this particular embodiment is equipped with a group of wire-bond pads 313 and a die contact pad 311. The packaging substrate 303 is equipped with a group of wire-bond posts 321 and a substrate contact pad 323. Electrical connections are formed between the wire-bond pads 313 on die 305 and the wire-bond posts 321 on packaging substrate 303, using suitable wire bonding techniques (bond wire 322 shown in FIG. 3) or other methodologies as are known in the art. However, unlike the prior art approach depicted in FIG. 2 above, a portion of an electrically conductive polymeric material 324, such as an electrically conductive adhesive or paint, is used to form an electrically conductive pathway between the substrate contact pads 323 and the die contact pads 311. Note that the electrically conductive polymeric material 324 overlaps the top surface of die 305 adjacent to die edge 330, and also overlaps a substantial portion of die contact pad 311. The finished device may then be encapsulated in a mold compound using techniques and materials well known in the art.

In this particular embodiment, the combination of die contact pad 311, substrate contact pad 323, and electrically conductive polymeric material 324 is used to provide Vss (ground) electrical connection between die 305 and packaging substrate 303. Each individual wire-bond pad 313, and its associated wire-bond post 321 and bond wire 322, may provide either Vdd (power), Vss (ground), or I/O signal electrical connection between the die 305 and the packaging substrate 303.

Figure 4:
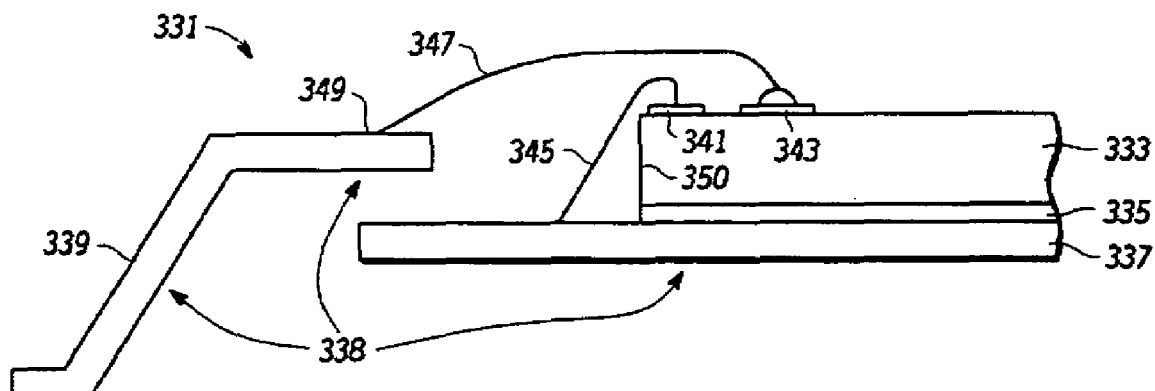
FIG. 4 is an illustration of an embodiment of a semiconductor device made in accordance with the teachings herein.

FIG. 4 illustrates another particular, non-limiting embodiment of a semiconductor device in accordance with the teachings herein. The device 331 depicted therein comprises a semiconductor die 333 disposed on a first major surface of a die mounting paddle 337 of a conductive package leadframe 338. The die 333 is attached to the die mounting paddle 337 of the leadframe 338 by means of a die attach adhesive 335, which may be electrically conductive or insulating. In other embodiments, a solder fillet may be used for this purpose.

The die 333 in this particular embodiment is equipped with a group of wire-bond pads 343 and a die contact pad 341. The packaging leadframe 338 is equipped with a group of wire-bond posts 349 and a die mounting paddle 337. The group of wire-bond posts 349 extend away from the die 333 and become the group of package interconnect leads 339 so that the semiconductor device 331 may be mounted on a host device (not shown).

Electrical connections are formed between the group of wire-bond pads 343 on the die 333 and the group of wire-bond posts 349 on the packaging leadframe 338 using bond wire 347 or other suitable wire bonding techniques or methods of forming electrical interconnection as are known in the art. A portion of an electrically conductive polymeric material 345, such as an electrically conductive adhesive or paint, is used to form an electrically conductive pathway between the leadframe paddle 337 and the die contact pads 341. Note that the electrically conductive polymeric material 345 overlaps the top surface of the die 333 adjacent to die edge 350, and also overlaps a substantial portion of the die contact pad 341. The finished device may then be encapsulated in a mold compound using techniques and materials well known in the art.

In the particular embodiment depicted in FIG. 4, the combination of die contact pad 341, leadframe paddle 337, and electrically conductive polymeric material 345 is used to provide a Vss (ground) electrical connection between the die 333 and packaging leadframe 338. Each individual wire-bond pad 343 and its associated wire-bond post 349 may provide either Vdd (power), Vss (ground), or I/O signal electrical connection between the die 333 and the packaging leadframe 338.

Figure 5:
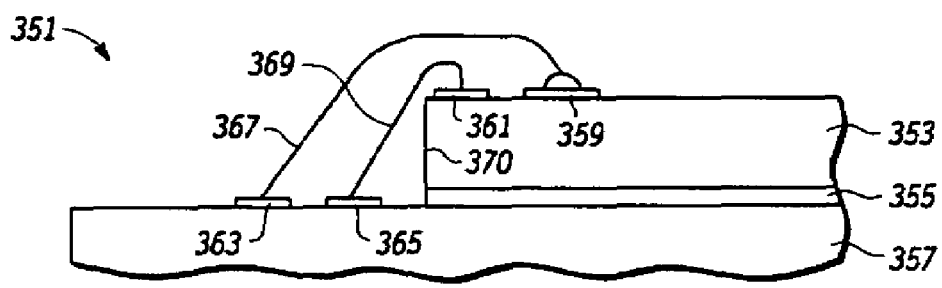
FIG. 5 is an illustration of an embodiment of a semiconductor device made in accordance with the teachings herein.

FIG. 5 illustrates another particular, non-limiting embodiment of a semiconductor device in accordance with the teachings herein. The device 351 depicted therein comprises a first semiconductor die 357 having a second semiconductor die 353 disposed on a first major surface thereof. The second die 353 is attached to the first die 357 with a layer of adhesive 355, which may be electrically conductive or insulating. In other embodiments, a solder fillet may be used for this purpose. Note that the second major surface of the first die 357 (not shown) may in turn be attached to another semiconductor die, a packaging substrate, or a packaging leadframe to create the electrical connection of the device 351 to a host device (not shown).

The second die 353 in this particular embodiment is equipped with a group of wire-bond pads 359 and a die contact pad 361. The first die 357 in this particular embodiment is equipped with a group of wire-bond pads 363 and a die contact pad 365. Electrical connections are formed between the wire-bond pads 359 on the second die 353 and the wire-bond pads 363 on the first die 357 using bond wire 367 or other suitable wire bonding techniques or methods as are known in the art.

A portion of an electrically conductive polymeric material 369 such as an electrically conductive adhesive or paint is used to form an electrically conductive pathway between the contact pads 365 of the first die 357 and the contact pads 361 of the second die 353. Note that the electrically conductive polymeric material 369 overlaps the top surface of the second die 353 adjacent to die edge 370 and also overlaps a substantial portion of the contact pad 361.

The finished device may be encapsulated in a suitable mold compound using techniques and materials well known in the art. In this particular embodiment, the combination of die contact pads 361, die contact pads 365, and electrically conductive polymeric material 369 is used to provide Vss (ground) electrical connection between first semiconductor die 357 and second semiconductor die 353. Each individual wire-bond pad 359 and its associated wire-bond pad 363 and bond wire 367 may provide either Vdd (power), Vss (ground), or I/O signal electrical connection between the first die 357 and the second die 353.

Figure 6:
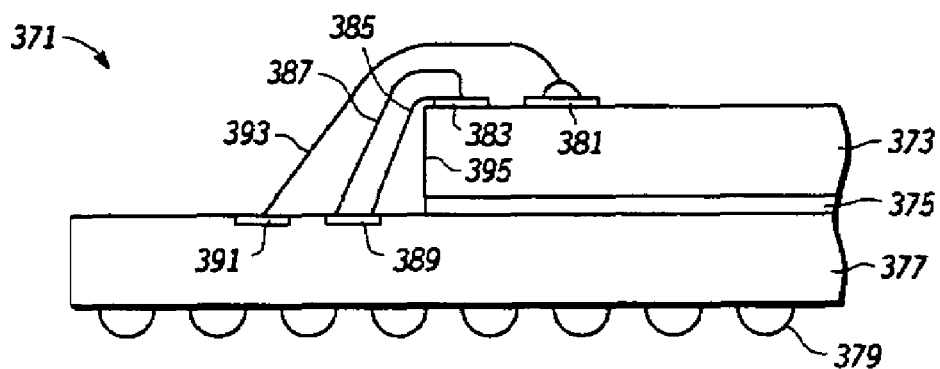
FIG. 6 is an illustration of an embodiment of a semiconductor device made in accordance with the teachings herein.

FIG. 6 illustrates yet another particular, non-limiting embodiment of a semiconductor device in accordance with the teachings herein. The device 371 depicted therein comprises a packaging substrate 377 having a semiconductor die 373 disposed on a first major surface thereof. The second opposing major surface of the package substrate 377 in this particular embodiment is equipped with a plurality of solder balls 379 disposed in a ball grid array (BGA) so that the semiconductor device 371 may be mounted on a host device (not shown). The die 373 is attached to the packaging substrate 377 with a layer of adhesive 375, which may be electrically conductive or insulating. In other embodiments, a solder fillet may be used for this purpose.

The die 373 in this particular embodiment is equipped with a group of wire-bond pads 381 and a die contact pad 383. The packaging substrate 377 is equipped with a group of wire-bond posts 391 and a substrate contact pad 389. Electrical connections are formed between the wire-bond pads 381 on die 373 and the wire-bond posts 391 on packaging substrate 377, using bond wire 393 or other suitable wire bonding techniques or methodologies as are known in the art. However, in contrast to the prior art device depicted in FIG. 2, a portion of an electrically conductive polymeric material 387, such as an electrically conductive adhesive or paint, is used to form an electrically conductive pathway between the substrate contact pads 389 and the die contact pads 383.

In the particular embodiment depicted in FIG. 6, it is desired to prevent direct contact between the electrically conductive polymeric material 387 and the die edge 395. To this end, an electrically non-conductive material is first applied to the die edge 395 to form an insulating layer 385. This approach may be useful, for example, for forming an electrically conductive pathway between the substrate contact pads 389 and the die contact pads 383 when the path is either Vdd (power) or I/O signal, and where contact with the die edge 395 would create shorts, signal noise or electrical instability. Note that the electrically non-conductive material 385 overlaps the top surface of die 373 adjacent to die edge 395, but does not also overlap any portion of die contact pad 383, while the electrically conductive polymeric material 387 overlaps a substantial portion of the die contact pad 383.

The finished device may then be encapsulated in a suitable mold compound using techniques and materials well known in the art. In this particular embodiment, the combination of the die contact pad 383, the substrate contact pad 389, and the electrically conductive polymeric material 387 is used to provide a $V_{dd}$ (power) connection between die 373 and packaging substrate 377. Each individual wire-bond pad 381, and its associated wire-bond post 391 and bond wire 393, may provide either $V_{dd}$ (power), $V_{ss}$ (ground), or I/O signal electrical connection between the die 373 and the packaging substrate 377.

Figure 7:
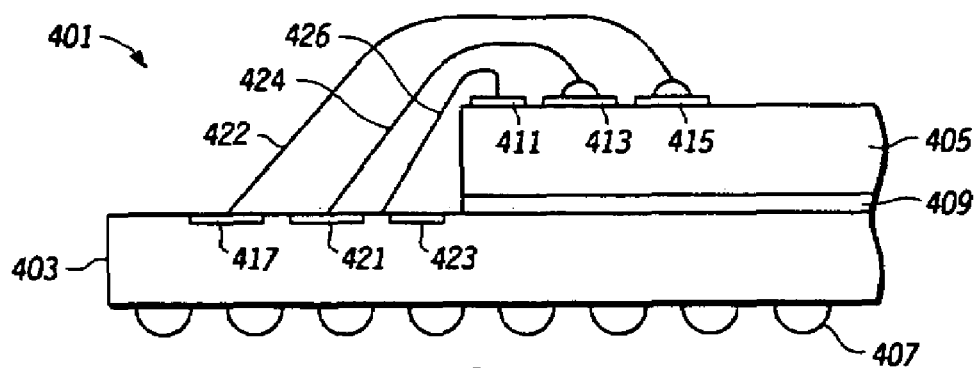
FIG. 7 is an illustration of an embodiment of a semiconductor device made in accordance with the teachings herein.

FIG. 7 illustrates another particular, non-limiting embodiment of a semiconductor device in accordance with the teachings herein. The device 401 depicted therein comprises a packaging substrate 403 having a semiconductor die 405 disposed on a first major surface thereof. The second opposing major surface of the packaging substrate 403 in this particular embodiment is equipped with a plurality of solder balls 407 disposed in a ball grid array (BGA) so that the semiconductor device 401 may be mounted within a host device. The die is attached to the package substrate 403 with a layer of adhesive 409, which may be electrically conductive or insulating. In other embodiments, a solder fillet may be used for this purpose.

The die 405 in this particular embodiment is equipped with a first group of wire-bond pads 413, a second group of wire-bond pads 415, and a die contact pad 411. The packing substrate 403 is equipped with a first group of wire-bond posts 421, a second group of wire-bond posts 417, and a substrate contact pad 423.

Electrical connections are formed between the first group of wire-bond pads 413 and the first group of wire-bond posts 421, and are also formed between second group of wire-bond pads 415 and the second group of wire-bond posts 417, using bond wire 424 and bond wire 422 or other suitable wire bonding techniques or methodologies as are known to the art. However, unlike prior art semiconductor devices such as that depicted in FIG. 2, here a portion of an electrically conductive polymeric material 426, such as an electrically conductive adhesive or paint, is used to form an electrically conductive pathway between the substrate contact pads 423 and the die contact pads 411.

The finished device may then be encapsulated in a suitable mold compound using techniques and materials well known in the art. In this particular embodiment, the combination of die contact pad 411, substrate contact pad 423, and electrically conductive polymeric material 426 is used to provide $V_{ss}$ (ground) electrical connection between die 405 and packaging substrate 403. Each individual wire-bond pad 413 or wire-bond pad 415, and its associated wire-bond post and bond wire, may provide either power, ground, or I/O signal electrical connection between the die 405 and the packaging substrate 403.

Figure 8:
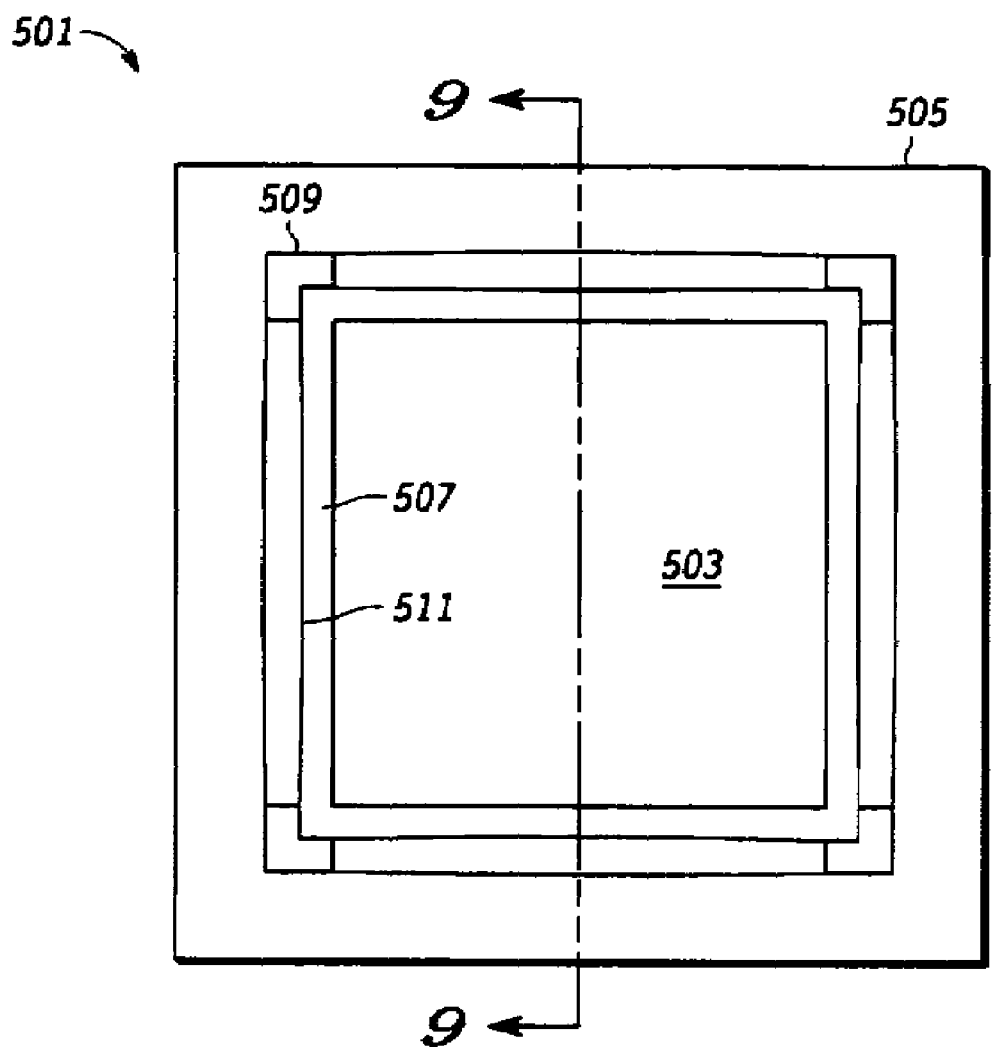
FIG. 8 is an illustration of an embodiment of a semiconductor device made in accordance with the teachings herein.
Figure 9:
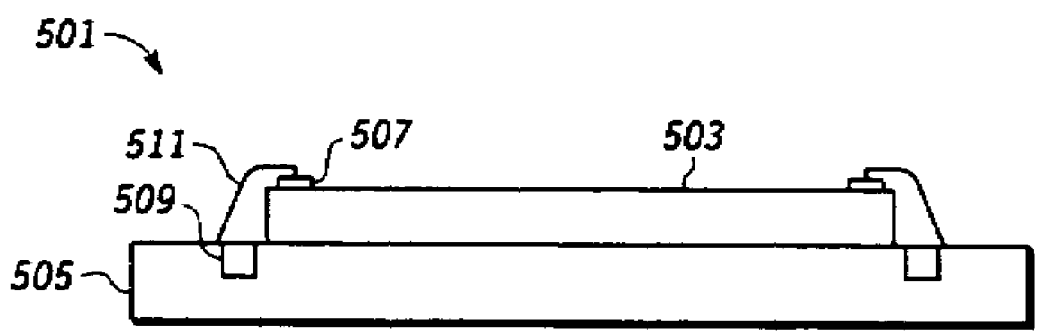
FIG. 9 is a cross-section taken along LINE 9-9 of FIG. 8.

FIGS. 8-9 illustrate some of the particular, non-limiting embodiments of contact pad configurations that may be used in the devices and methodologies disclosed herein. With reference to FIGS. 8-9, the device 501 depicted therein comprises a semiconductor die 503 disposed on a packaging substrate 505. A metal $V_{SS}$ (ground) contact pad 507 is disposed about the periphery of the die 503. Similarly, a metal $V_{SS}$ (ground) contact pad 509 is provided on the substrate 505 in the form of a ring disposed about the exterior of the die 503. The $V_{SS}$ contact pad 507 is in electrical communication with the packaging substrate $V_{SS}$ contact pad 509 by way of an electrically conductive adhesive 511 which is disposed along the majority of each edge of the semiconductor die 503. Hence, in this configuration, $V_{SS}$ contact pad 507 on die 503 is electrically coupled to $V_{SS}$ contact pad 509 on substrate 505 around a majority of the die 503 periphery, by use of electrically conductive adhesive 511.

Figure 10:
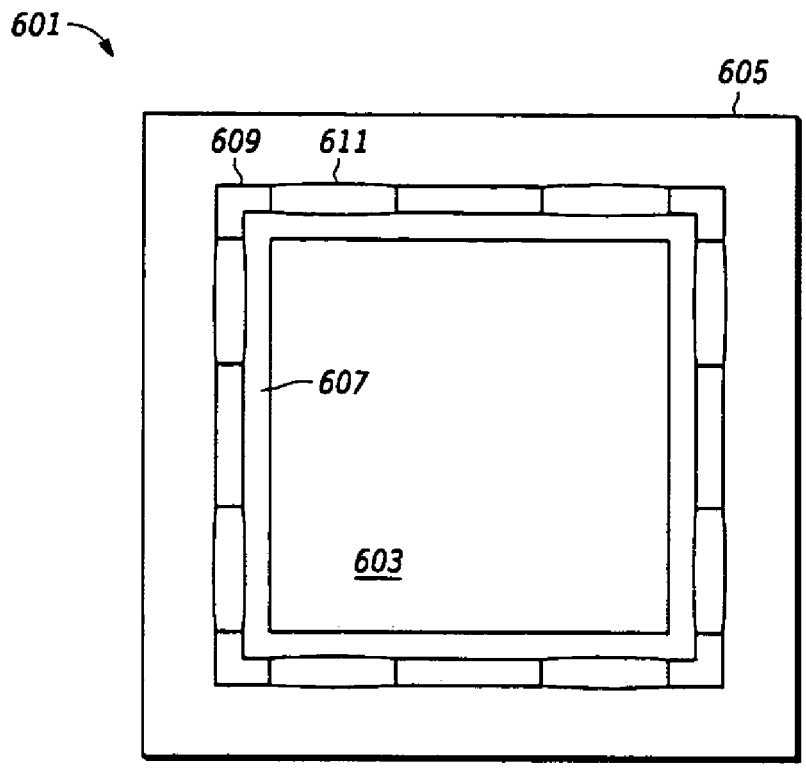
FIG. 10 is an illustration of an embodiment of a semiconductor device made in accordance with the teachings herein.

With reference to FIG. 10, the device 601 depicted therein comprises a semiconductor die 603 disposed on a packaging substrate 605. A $V_{SS}$ contact pad 607 is provided in the form of an aluminum ring disposed about the periphery of the die 603. Similarly, a ground contact pad 609 is provided on the substrate 605 in the form of a ring disposed about the exterior of the die 603. The $V_{SS}$ contact pad 607 is in electrical communication with the ground pad 609 by way of an electrically conductive adhesive 611 which is disposed in segments about each edge of the die 603.

Figure 11:
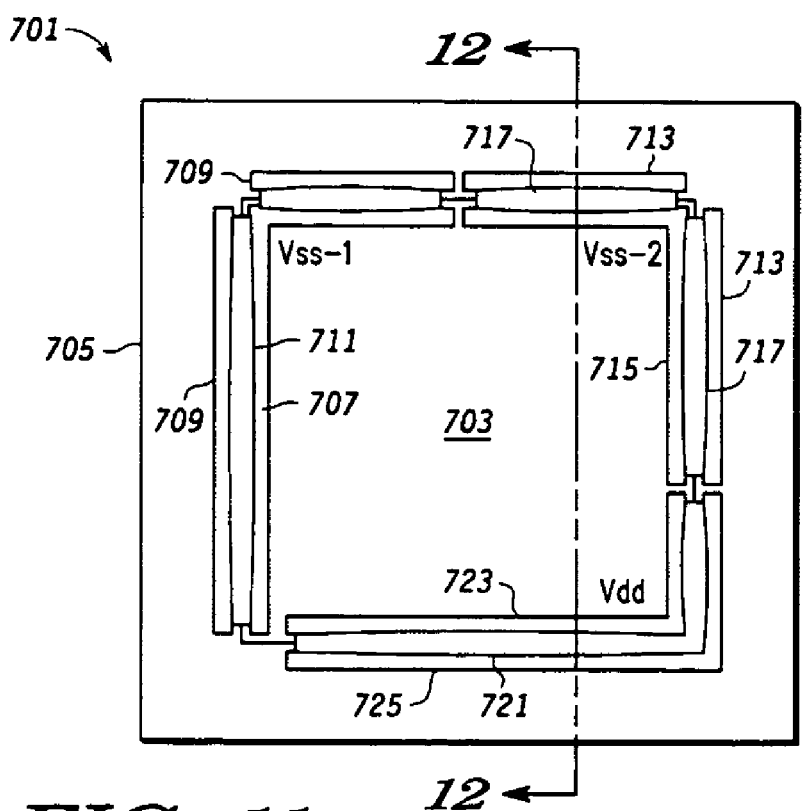
FIG. 11 is an illustration of an embodiment of a semiconductor device made in accordance with the teachings herein.
Figure 12:
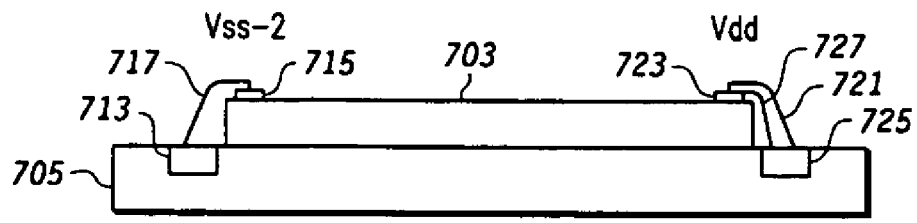
FIG. 12 is a cross-section taken along LINE 12-12 of FIG. 11.

With reference to FIGS. 11-12, the device 701 depicted therein comprises a semiconductor die 703 disposed on a packaging substrate 705. A first $V_{SS}$ contact pad 707 is provided on the die 703 in the form of an aluminum pad partially disposed about the periphery of the die 703. Similarly, ground contact pads 709 are provided on the substrate 705 in the form of contact pad segments disposed about the exterior of the die 703. The first $V_{SS}$ contact pad 707 is in electrical communication with the ground pads 709 by way of an electrically conductive adhesive 711 which is partially disposed about the edge of the die 703.

The device 701 of FIGS. 11-12 further comprises a second $V_{SS}$ contact pad 715 on the die 703 in the form of an aluminum pad partially disposed about the periphery of the die 703. Similarly, ground contact pads 713 are provided on the substrate 705 in the form of contact pad segments disposed about the exterior of the die 703. The second $V_{SS}$ contact pad 715 is in electrical communication with the ground pads 713 by way of an electrically conductive adhesive 717 which is partially disposed about the edge of the die 703.

The device 701 of FIGS. 11-12 further comprises a $V_{dd}$ (power) contact pad 723 on the die 703 in the form of an aluminum pad partially disposed about the periphery of the die 703. Similarly, contact pad 725 is provided on the substrate 705 in the form of a contact pad segment disposed about the exterior of the die 703. The $V_{dd}$ contact pad 723 is in electrical communication with the pad 725 by way of an electrically conductive adhesive 721 which is partially disposed about the edge of the die 703. The electrically conductive adhesive 721 is further disposed over a non-conductive material 727 (see FIG. 11) that insulates the edge of the die and over which is disposed the electrically conductive adhesive 721.

It will thus be appreciated that the embodiment of FIGS. 11-12 represents a configuration with three electrically separate nets formed in accordance with the teachings herein. In particular, a first $V_{ss}$ partial ring segment, a second $V_{ss}$ partial ring segment, and a third $V_{dd}$ partial ring segment are formed about the periphery of the die 703. It should be further noted that additional segments of $V_{ss}$ (ground) and $V_{dd}$ (power) may be added to further extend the number of unique electrical net connections between the die 703 and the package substrate 705.

As previously noted, some embodiments of the methodologies and devices described herein enable more compact contact pad configurations than are possible with conventional wire-bond pad configurations. This aspect may be further understood with reference to FIGS. 13-14.

Figure 13:
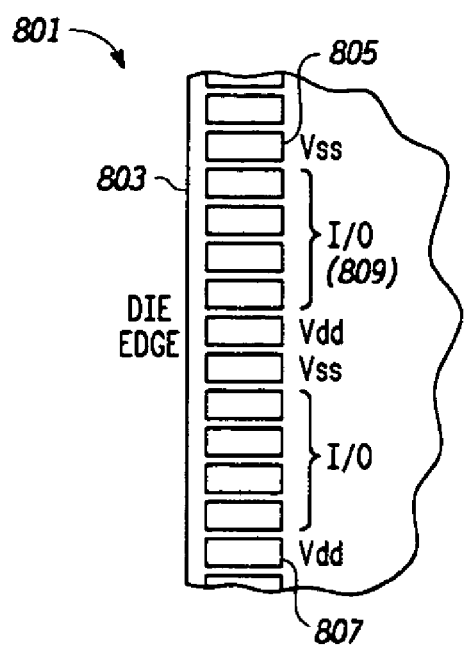
FIG. 13 is an illustration of a prior art bond pad configuration.

FIG. 13 illustrates a prior art wire-bond pad configuration 801 disposed at the periphery of a die 803. As seen therein, the configuration 801 features $V_{ss}$ wire-bond pads 805, $V_{dd}$ wire-bond pads 807, and I/O signal wire-bond pads 809, which are distributed among each other.

Figure 14:
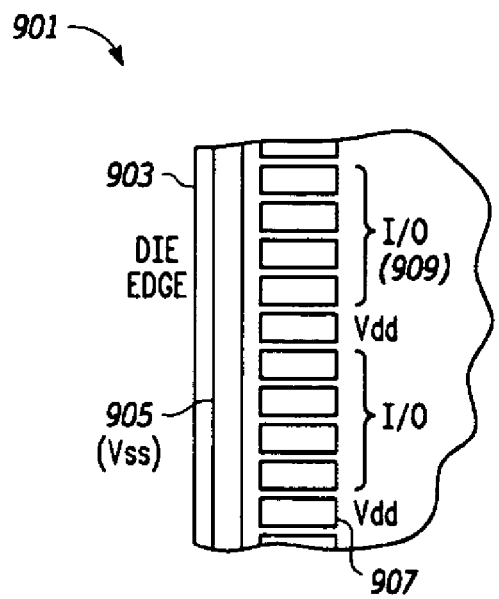
FIG. 14 is an illustration of an embodiment of a contact pad and bond pad configuration in accordance with the teachings herein.

FIG. 14 illustrates one particular, non-limiting embodiment of a wire-bond and contact pad configuration 901 in accordance with the teachings herein which is disposed at the periphery of a die 903. The configuration 901 depicted therein features a $V_{ss}$ contact pad 905, $V_{dd}$ wire-bond pads 907, and I/O signal wire-bond pads 909. However, in contrast to the wire-bond pad configuration 801 of FIG. 13, in the wire-bond and contact pad configuration 901 of FIG. 14, a narrow, ganged outer $V_{ss}$ contact pad 905 replaces the inline $V_{ss}$ wire-bond pads. This provides a more compact bank of wire-bond pads. Hence, this contact pad configuration may provide substantial space savings on the die 903.

Various types of electrically conductive polymeric compositions may be used in the devices and methodologies described herein. These include, without limitation, electrically conductive adhesives, paints, inks, pastes, colloids or tapes, such as those that combine flakes of silver, nickel, gold or other electrically conductive metals with a polymer matrix. Specific examples include silver filled epoxy adhesives and isotropic conductive adhesive (ICA). The electrically conductive polymeric compositions may be one-part, two-part or multi-part systems. The electrically conductive polymeric compositions may also be isotropically or anisotropically electrically conductive, and may be thermoplastic or thermosetting. Moreover, the conductive particles in these compositions may be oriented parallel to a common axis or plane, or may be randomly oriented.

Various fillers or pigments may be used in the electrically conductive polymeric compositions employed in the devices and methodologies described herein. These include, but are not limited to, various electrically conductive powders such as silver, gold, nickel, copper, silver-palladium, carbon and graphite powders and the like. Such powders may comprise flakes, fibers, tubes, or sheets of one or more conductive materials.

Various binders may be used in the electrically conductive polymeric compositions employed in the devices and methodologies described herein. These include, but are not limited to, binders based on acrylics, epoxides, fluoroelastomers, polyesters, cellulosic resins, silicones, ethylene vinyl acetate, and the like.

Various solvents, diluents, thinners, extenders or matrices may be used in the electrically conductive polymeric compositions employed in the devices and methodologies described herein. These include, but are not limited to, water, acetone, isopropyl alcohol, methyl ethyl ketone, methyl isobutyl ketone, and carbitol acetate.

The conductive polymeric materials described herein may be applied in a variety of ways. For example, these materials may be applied to a substrate as a conductive die attach which overlaps the edges of the die and which contacts the ground pads on the top side of the die, thereby forming an electrically conductive pathway between these pads and the substrate ground pads.

Alternatively, the conductive die attach may be applied to the substrate to provide partial coverage of the die edge (for example, about ⅓ to about ⅔ of the die edge). A second conductive material, which may be the same or different from the conductive die attach, may then be utilized to create an electrically conductive pathway between the conductive die attach and the ground contact pads disposed on the top of the die.

In yet another embodiment, a non-conductive die attach material may be applied to the substrate to provide coverage of the die edge and form an insulating layer. A conductive second material may then be utilized to create an electrically conductive pathway between the pads on the top side of the die and pads on the substrate. This embodiment is useful when a ground path shorted to the silicon substrate is not desired as, for example, in the case where a dedicated ground connection between the die and substrate is preferred.

In still other embodiments, a conductive die attach tape may be utilized to mount the die on the substrate especially for thinner die application. A conductive die attach material (which may be the same or different from the conductive die attach tape) may then be used to create a connection between the conductive die attach tape and the ground contact pads disposed on the top of the die.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for forming contacts, comprising:
providing a first semiconductor device having first and second opposing major surfaces, wherein the first major surface is attached to a substrate having a first group of contact pads disposed thereon, and wherein the second major surface has a second group of contact pads disposed thereon; and
forming an electrically conductive pathway between the first and second groups of contacts with an electrically conductive polymeric composition.

2. The method of claim 1, wherein the polymeric composition is an adhesive.

3. The method of claim 1, wherein the polymeric composition is a paint.

4. The method of claim 1, wherein the electrical connection is formed by applying the adhesive about a portion of the periphery of the first semiconductor device.

5. The method of claim 1, wherein the first semiconductor device is a die, and wherein the substrate is a packaging substrate.

6. The method of claim 1, wherein the first semiconductor device is a die, and wherein the substrate is a ball grid array (BGA) substrate.

7. The method of claim 6, wherein the die is further equipped with a third group of contact pads, wherein the substrate is further equipped with a fourth group of contact pads, and wherein each contact pad in the third group is in electrical communication with a contact pad in the fourth group by way of a bond wire.

8. The method of claim 7, wherein the die is further equipped with a fifth group of contact pads, wherein the substrate is further equipped with a sixth group of contact pads, and wherein each contact pad in the fifth group is in electrical communication with a contact pad in the sixth group by way of a bond wire.

9. The method of claim 1, wherein the first semiconductor device is a die, and wherein the substrate is a leadframe.

10. The method of claim 9, wherein the leadframe comprises a die mounting paddle.

11. The method of claim 10, wherein the die is further equipped with a third group of contact pads, wherein the lead frame is further equipped with a fourth group of contact pads, and wherein each contact pad in the third group is in electrical communication with a contact pad in the fourth group by way of a bond wire.

12. The method of claim 11, wherein the first group of contact pads is disposed on the die mounting paddle.

13. The method of claim 1, wherein the first semiconductor device is a die, and wherein the substrate is a second semiconductor device.

14. The method of claim 13, wherein the second semiconductor device is a die.

15. The method of claim 13, wherein the first semiconductor device is further equipped with a third group of contact pads, wherein the second semiconductor device is further equipped with a fourth group of contact pads, and wherein each contact pad in the third group is in electrical communication with a contact pad in the fourth group by way of a bond wire.

16. The method of claim 1, wherein the first semiconductor device has an electrically insulated edge, and wherein the electrically conductive pathway extends across the electrically insulating edge.

17. The method of claim 16, wherein the first semiconductor device is a die, and wherein the substrate is a BGA substrate.

18. The method of claim 17, wherein the first semiconductor device is further equipped with a third group of contact pads, wherein the second semiconductor device is further equipped with a fourth group of contact pads, and wherein each contact pad in the third group is in electrical communication with a contact pad in the fourth group by way of a bond wire.

19. A device, comprising:

a substrate having a first group of contact pads disposed thereon;

a first semiconductor device having first and second opposing major surfaces; wherein said first major surface is attached to said substrate, wherein said second major surface has a second group of contact pads disposed thereon, and wherein said first and second group of contacts are in electrical communication with each other by way of an electrically conductive polymeric composition.

20. The device of claim 19, wherein said polymeric composition is selected from the group consisting of paints and adhesives.

* * * * *